(12) United States Patent
Cornic et al.

(10) Patent No.: US 12,241,967 B2
(45) Date of Patent: Mar. 4, 2025

(54) ACTIVE ANTENNA RADAR WITH EXTENDED ANGULAR COVERAGE

(71) Applicant: THALES, Courbevoie (FR)

(72) Inventors: Pascal Cornic, Brest (FR); Yoan Veyrac, Merignac (FR); Renan Le Gall, Brest (FR)

(73) Assignee: THALES, Courbevoie (FR)

( * ) Notice: Subject to any disclaimer, the term of this patent is extended or adjusted under 35 U.S.C. 154(b) by 387 days.

(21) Appl. No.: 17/576,657

(22) Filed: Jan. 14, 2022

(65) Prior Publication Data
US 2022/0229172 A1    Jul. 21, 2022

(30) Foreign Application Priority Data

Jan. 19, 2021 (FR) ..................................... 2100491

(51) Int. Cl.
*G01S 13/89* (2006.01)
*H01Q 13/02* (2006.01)
(Continued)

(52) U.S. Cl.
CPC ............. *G01S 13/89* (2013.01); *H01Q 13/02* (2013.01); *H01Q 19/062* (2013.01);
(Continued)

(58) Field of Classification Search
CPC ...... G01S 13/89; H01Q 13/02; H01Q 19/062; H01Q 19/10; H03F 3/245; H03F 2200/294; H03F 2200/451
(Continued)

(56) References Cited

U.S. PATENT DOCUMENTS 4,544,925 A * 10/1985 Drabowitch ........... H01Q 25/00
342/16
5,038,147 A * 8/1991 Cerro ................... H01Q 3/2658
342/368
(Continued)

FOREIGN PATENT DOCUMENTS

AU          2011214118 B2 * 12/2014 ............. H01Q 15/08
DE      10 2014 106 060 A1    11/2015
(Continued)

*Primary Examiner* — Nuzhat Pervin
(74) *Attorney, Agent, or Firm* — BakerHostetler

(57) ABSTRACT

An active antenna radar able to produce an image with high angular resolution over a wide angular coverage, the antenna includes a number N of transmission channels and a number M of reception channels, each transmission channel and reception channel comprising an elementary antenna: each elementary antenna comprises a lens or a reflector associated with an array of elementary sources, the sources being configured to illuminate the lens or the reflector and at least the apertures being substantially arranged in the focal plane of the lens or centred around the focal point of the reflector; each elementary transmission or reception source being able to form or receive, respectively, a beam focused in a given direction, the directions being different from one transmission or reception source to another of one and the same elementary antenna; each elementary transmission or reception source being connected to a power amplifier or to a low-noise amplifier, respectively, and to switching means allowing the source to be supplied or not to be supplied with power or the signals from the source to be received or not to be received, respectively.

16 Claims, 7 Drawing Sheets

(51) Int. Cl.
*H01Q 19/06* (2006.01)
*H01Q 19/10* (2006.01)
*H03F 3/24* (2006.01)

(52) U.S. Cl.
CPC .............. *H01Q 19/10* (2013.01); *H03F 3/245* (2013.01); *H03F 2200/294* (2013.01); *H03F 2200/451* (2013.01)

(58) Field of Classification Search
USPC ........................................................ 342/175
See application file for complete search history.

(56) References Cited

U.S. PATENT DOCUMENTS

| | | | | |
|---|---|---|---|---|
| 5,084,708 | A * | 1/1992 | Champeau | H01Q 3/2682 |
| | | | | 342/377 |
| 5,424,748 | A * | 6/1995 | Pourailly | H01Q 25/002 |
| | | | | 342/157 |
| 5,734,349 | A * | 3/1998 | Lenormand | H04B 7/18515 |
| | | | | 342/372 |
| 8,482,455 | B2 | 7/2013 | Kemkemian | G01S 13/003 |
| | | | | 342/107 |
| 8,780,000 | B2 * | 7/2014 | Palacin | H01Q 25/007 |
| | | | | 343/778 |
| 8,923,225 | B2 * | 12/2014 | Sydor | H04W 72/541 |
| | | | | 370/329 |
| 9,535,151 | B2 * | 1/2017 | Lynch | G01S 3/46 |
| 9,541,639 | B2 * | 1/2017 | Searcy | G01S 7/03 |
| 9,888,473 | B2 * | 2/2018 | Seo | H04W 72/0446 |
| 10,578,707 | B2 * | 3/2020 | Kim | G01S 13/931 |
| 10,620,305 | B2 * | 4/2020 | Cornic | H01Q 1/3233 |
| 10,775,498 | B2 * | 9/2020 | Vacanti | G01S 13/4472 |
| 10,938,105 | B2 * | 3/2021 | Snyder | H01Q 19/193 |
| 11,322,853 | B2 * | 5/2022 | Hirabe | H01Q 25/04 |
| 11,506,773 | B1 * | 11/2022 | Everett | G01S 7/03 |
| 11,971,651 | B2 * | 4/2024 | Sharma | G03B 3/10 |
| 2009/0174591 | A1 * | 7/2009 | Cornic | G01S 13/584 |
| | | | | 342/29 |
| 2010/0271254 | A1 * | 10/2010 | Kanamoto | G01S 13/931 |
| | | | | 342/146 |
| 2011/0032141 | A1 * | 2/2011 | Elleaume | H01Q 21/0025 |
| | | | | 342/197 |
| 2011/0140952 | A1 * | 6/2011 | Kemkemian | G01S 13/426 |
| | | | | 342/146 |
| 2012/0075149 | A1 * | 3/2012 | Palacin | H01Q 1/28 |
| | | | | 343/711 |
| 2012/0081247 | A1 * | 4/2012 | Kemkemian | H01Q 3/2605 |
| | | | | 342/29 |
| 2014/0139370 | A1 * | 5/2014 | Hamner | G01S 13/4463 |
| | | | | 342/175 |
| 2014/0354499 | A1 * | 12/2014 | Legay | H01Q 3/26 |
| | | | | 343/778 |
| 2017/0062948 | A1 * | 3/2017 | Artemenko | H04B 7/0617 |
| 2018/0115185 | A1 * | 4/2018 | John | A61N 1/3785 |
| 2018/0302150 | A1 * | 10/2018 | Chang | G01S 13/933 |
| 2020/0091622 | A1 * | 3/2020 | Turpin | H01Q 5/42 |
| 2020/0091996 | A1 * | 3/2020 | Tabatabaei | H04B 7/18515 |
| 2020/0185830 | A1 * | 6/2020 | West | H01Q 3/2682 |

FOREIGN PATENT DOCUMENTS

| | | | | |
|---|---|---|---|---|
| EP | 1152258 | A1 * | 11/2001 | G01S 13/89 |
| EP | 1170599 | A1 * | 1/2002 | G01S 7/032 |
| EP | 1233282 | A1 * | 8/2002 | G01S 13/28 |
| EP | 1304763 | A1 * | 4/2003 | H01Q 1/02 |
| EP | 1351333 | A2 * | 10/2003 | G01S 13/426 |
| EP | 1170599 | B1 * | 3/2004 | G01S 7/032 |
| EP | 2429036 | A1 * | 3/2012 | H01Q 1/28 |
| EP | 2574957 | A1 * | 4/2013 | G01S 13/53 |
| EP | 2575210 | A1 * | 4/2013 | H01Q 1/286 |
| EP | 3125362 | A1 * | 2/2017 | H01Q 1/2283 |
| WO | 2005/103756 | A1 | 11/2005 | |
| WO | WO-2015078682 | A1 * | 6/2015 | G01S 13/343 |
| WO | 2021/058674 | A1 | 4/2021 | |
| WO | 2021/219398 | A1 | 11/2021 | |
| WO | 2022/073727 | A1 | 4/2022 | |

* cited by examiner 11 (TX), 12 (RX)

11 (TX), 12 (RX)

1' (TX), 1'' (RX)

11 (TX)

12 (RX)

ACTIVE ANTENNA RADAR WITH EXTENDED ANGULAR COVERAGE

CROSS-REFERENCE TO RELATED APPLICATIONS

This application claims priority to foreign French patent application No. FR 2100491, filed on Jan. 19, 2021, the disclosure of which is incorporated by reference in its entirety.

FIELD OF THE INVENTION

The field of the invention is that of active antenna radars, and more particularly radars intended to cover a given solid angle with high angular discrimination. The invention notably applies to radars intended to be positioned on a platform (or a carrier) in motion, notably Doppler radars, for example the radars for viewing runways from an airliner, performing an EVS (enhanced vision system) function, or else motor vehicle radars for anti-collision or imaging functions for self-driving vehicles.

BACKGROUND

One problem to be addressed is that of having a near-instantaneous and high-angular-resolution image of the scene present in all of the field of vision of a radar, while limiting the digital processing needs required to provide this function and decreasing the complexity and the cost of such a radar. This capability is particularly advantageous on a carrier that moves quickly in relation to the scene to be observed, or when the scene itself changes rapidly, or else when both of these conditions are encountered simultaneously.

In such cases, the refresh time has to be reduced, which requires reducing the number of pointing directions of the antenna to cover all of the angular range. In practice, the angular range to be processed often has a substantial width, typically several tens of degrees, while the need for focusing imposes a narrow elementary beam, typically with a width smaller than a degree, which increases the difficulty in defining a solution that is both simple and effective.

The angular range to be covered also depends on the distance with respect to the region of interest. In the case in which it is sought to cover a region of predefined width, the angular coverage required depends on the distance. This is the case with a landing radar, with which it is sought to cover a region on the ground corresponding to the width of the runway and its immediate area. The radar should therefore ideally have a range (distance) that is substantial in a restricted angular range and also be capable of scanning a wider region at a shorter distance.

Additionally, in order to reduce the complexity and to reduce the cost of a radar, it is often necessary to reduce the number of transmission and reception channels which results in a gappy antenna array that produces ambiguous lobes and has a reduced angular coverage. The issue is then to optimize the configuration of the antenna array and the processing of the radar to obtain the best possible performance while limiting complexity and cost.

In the prior art, to achieve the desired result, the conventional solutions of mechanical scanning type that implement a narrow beam to scan the field of observation are not suitable because of the cycle time required to refresh the information. Additionally, this type of solution often experiences a failure in reliability with time, in particular when the scanning speed has to be high.

A second, very widely used type of radar is based on one- or two-dimensional electronic scanning antennas. These antennas require a high number of controlled-phase radiating elements to achieve both good resolution and a wide angular coverage. Unfortunately, these solutions are often very expensive and ill-suited for applications that require moderate costs.

The solutions based on computational beamforming, implementing transmission via a single wide-field antenna and an antenna array with multiple channels for reception, allow instantaneous observation of the angular range but suffer from low discrimination, due to the lack of selectivity of the transmission antenna, and are liable to require a high-power transmitter, given the low antenna gain for transmission.

Other solutions, of MIMO (multiple-input multiple-output) type, associating a plurality of transmission channels and a plurality of reception channels, are possible. In this case, there are N transmission channels and M reception channels, and the elementary transmission power may remain modest. However, the radar processing has to be applied to all of these N×M channels, which may require an extremely large amount of computing, in particular for a real-time application. This amount of computing increases with increasing number of pointing directions of the beam. This may be out of reach for cost, integration and power-consumption reasons.

Patent application FR1910613 presents a solution based on an active antenna radar comprising N transmission channels and M reception channels, transmitting in bursts of pointing cycles, said antenna covering a given angular range during a detection time unit of duration T, said time unit corresponding to a burst in which the N transmission channels are successively focused in different pointing directions (De pointing directions), the pointing direction on transmission being changed from recurrence to recurrence (from pulse to pulse transmitted), each time unit of duration T comprising a periodic repetition of a number C of identical pointing cycles, each of these cycles comprising a number P of recurrences, the set of these P recurrences covering the De pointing directions; and at least one beam is formed on reception at each recurrence in a direction included in the angular range focused on transmission in the pointing direction corresponding to said recurrence.

This solution simultaneously makes it possible to produce a near-instantaneous image of the observation scene, to achieve the objective of angular discrimination and to substantially decrease the amount of computing with respect to a solution based on conventional MIMO processing. It is applicable to a conventional active electronically scanned array (AESA) antenna architecture or to a MIMO architecture. It is achievable using a low-transmission-power technology and standard electronic components.

Patent application FR2004262, which is based on the same principles, proposes an alternative to application FR1910613 consisting in modifying, with a pseudo-random code, the order of the pointing directions of the beam from pointing cycle to pointing cycle of one and the same Doppler burst so as to obtain an irregular sampling of the signal in the Doppler domain and to produce for reception a correlator adapted to this irregular sampling in order to estimate the Doppler frequency of the targets detected unambiguously. This alternative solution thus makes it possible to determine the speed of targets when the radar is ambiguous in terms of Doppler.

Patent application FR2010279, which is based on the same principles as the two applications cited above, makes it possible to use gappy antenna arrays exhibiting ambiguities without that requiring complex processing to remove the ambiguities and while limiting the data refresh time and the amount of computing. The solution is based on an array of elementary transmission antennas and an array of elementary reception antennas of the same angular aperture, the transmission array being ambiguous with a number $N_{ambTX}$ greater than or equal to 2 of ambiguous lobes in said angular aperture, the reception array comprising at least one ambiguous lobe in said angular aperture, said transmission and reception arrays being arranged so that the product of the transmission and reception patterns produces just one main beam in the range defined by said angular aperture, and the coverage of the angular range given by said radar being obtained:

by forming, on transmission, patterns focused in a range limited to the transmission ambiguous range;

by simultaneously forming a plurality of reception patterns focused, on reception, in the ambiguous transmission directions.

By advantageously using the ambiguities of an antenna array, this solution makes it possible to cover a given angular range with a reduced number of antenna pointing control states on transmission.

The solutions of the prior art described in the three patent applications cited above make it possible to at least partially solve the problem of optimizing the configuration of the antenna array and the processing of the radar, they make it possible to process a given angular range of tens of degrees, and to manage the focusing needs, i.e to form a narrow elementary beam, typically with a width narrower than one degree.

However, the solutions of the prior art make it possible to process a limited angular range of tens of degrees, as mentioned above.

SUMMARY OF THE INVENTION

The invention aims to overcome the abovementioned drawbacks of the prior art.

More particularly, it aims to provide an active antenna radar able to produce an image with high angular resolution over a wide field of vision, while optimizing the configuration of the antenna array and optimizing the volume of calculations when processing the radar.

A subject of the invention that makes it possible to overcome these drawbacks is an active antenna radar able to produce an image with high angular resolution over a wide angular coverage, the antenna being an array antenna comprising a number N of transmission channels and a number M of reception channels, each transmission channel and reception channel comprising an antenna sub-array, called elementary antenna, characterized in that:

each elementary antenna comprises a lens or a reflector associated with an array of elementary sources, said sources being configured to illuminate the lens or the reflector and at least their apertures being substantially arranged in the focal plane of said lens or centred around the focal point of said reflector;

each transmission elementary source being able to form a beam focused in a given direction, the directions being different from one transmission source to another of one and the same elementary antenna;

each elementary reception source being able to receive a beam focused in a given direction, the directions being different from one reception source to another of one and the same elementary antenna;

each transmission elementary source being connected to a power amplifier and to a switching means allowing said source to be supplied or not to be supplied with power; and each reception elementary source being connected to a low-noise amplifier and to a switching means allowing the signals from said source to be received or not to be received.

What is meant by "source" or "elementary source" is a source able to produce or receive radiation. A source comprises at least one radiating element (and may comprise a polarizer and/or a filter). The sources may be patches printed on a substrate, or else waveguides and/or horns.

What should be understood by "aperture" of the sources is the transmission output aperture and the reception input aperture (according to the direction of circulation of the RF waves in the source).

The invention consists of an active antenna radar comprising an antenna array whose angular coverage is provided by a double scan:

in a limited angular range, corresponding to the aperture and to the pointing direction of the elementary antennas, using the known electronic scanning means (notably those described in the three applications cited above);

in the entire angular range, by moving this limited angular range and potentially by modifying its width, using electronic switching of the pointing direction of each elementary antenna of the array (by acting on the switching of one or a plurality of sources of the antenna), for transmission and for reception.

What is meant by "electronic scanning" is any electronic means making it possible to form focused beams from the antenna array, such as switching, phase-shifting or MIMO processing in particular. For transmission, the beam is pointed in a given direction according to a phase distribution, in a known manner, while for reception digital processing is carried out. The reception digital processing is also well known and typically corresponds to a complex phase weighting in which a digital sum of the received signals is produced, in which each received signal is assigned a phase, the weighting determining the pointing of the beam for reception.

The high angular resolution is obtained by applying an AESA- or MIMO-type treatment in the limited angular range covered by the elementary antennas.

In the case of an elementary antenna focused by reflector, the reflector may be of Cassegrain, or folded Cassegrain, type, or else a reflecting antenna composed of an array of unit cells (known as a "reflect-array") or any other reflector technology known to a person skilled in the art.

In the case of an elementary antenna focused by lens, besides conventional dielectric lenses, it is possible to use technologies of Luneburg lens type, or else other types of lens known to a person skilled in the art.

The radar according to the invention may further comprise one or more of the following features, taken individually or in any technically feasible combination.

According to one embodiment, the elementary sources are in the form of elements printed on a flat substrate, called patches, the plane of said substrate being arranged substantially in the focal plane of the lens or substantially centred around the focal point of the reflector.

As an alternative to the preceding embodiment, the elementary sources may be in the form of waveguides and/or of horns, the aperture of each waveguide and/or horn being arranged substantially in the focal plane of said lens or substantially centred around the focal point of said reflector.

According to one embodiment, each elementary antenna comprises a lens, at least the apertures of the elementary sources being arranged in the focal plane of said lens.

According to one particular embodiment, each lens is made of a dielectric material. Preferably, the dielectric material has a relative permittivity lower than or equal to 4, even more preferably between 2 and 4.

According to one embodiment, the reception and transmission elementary sources of one and the same elementary antenna are each connected to a dedicated switching means and to a dedicated amplifier, respectively.

As an alternative to the preceding embodiment, a plurality of reception and transmission elementary sources of one and the same elementary antenna may be connected to one another so as to form a group of elementary sources that are connected to one and the same switching means and to one and the same amplifier, respectively.

Advantageously, the dimensions of the antenna array are adapted to the target angular resolution.

Advantageously, the switching means of an elementary antenna are adapted so as to adjust the pointing directions and/or the angular coverage of said elementary antenna, said switching means being able to activate an elementary source, a group of sources or all of the sources of the array of sources, for transmission and/or for reception.

According to one embodiment, said active antenna is of active electronically scanned array (AESA) type.

According to another embodiment, said active antenna is of multiple-input multiple-output (MIMO) type.

BRIEF DESCRIPTION OF THE DRAWINGS

Other features, details and advantages of the invention will become apparent from reading the description given with reference to the appended drawings, which are given by way of example and in which, respectively.

In all of these figures, identical references may denote identical or similar elements.

In addition, the various portions shown in the figures are not necessarily shown to a uniform scale in order to make the figures more legible.

DETAILED DESCRIPTION

Figure 1:
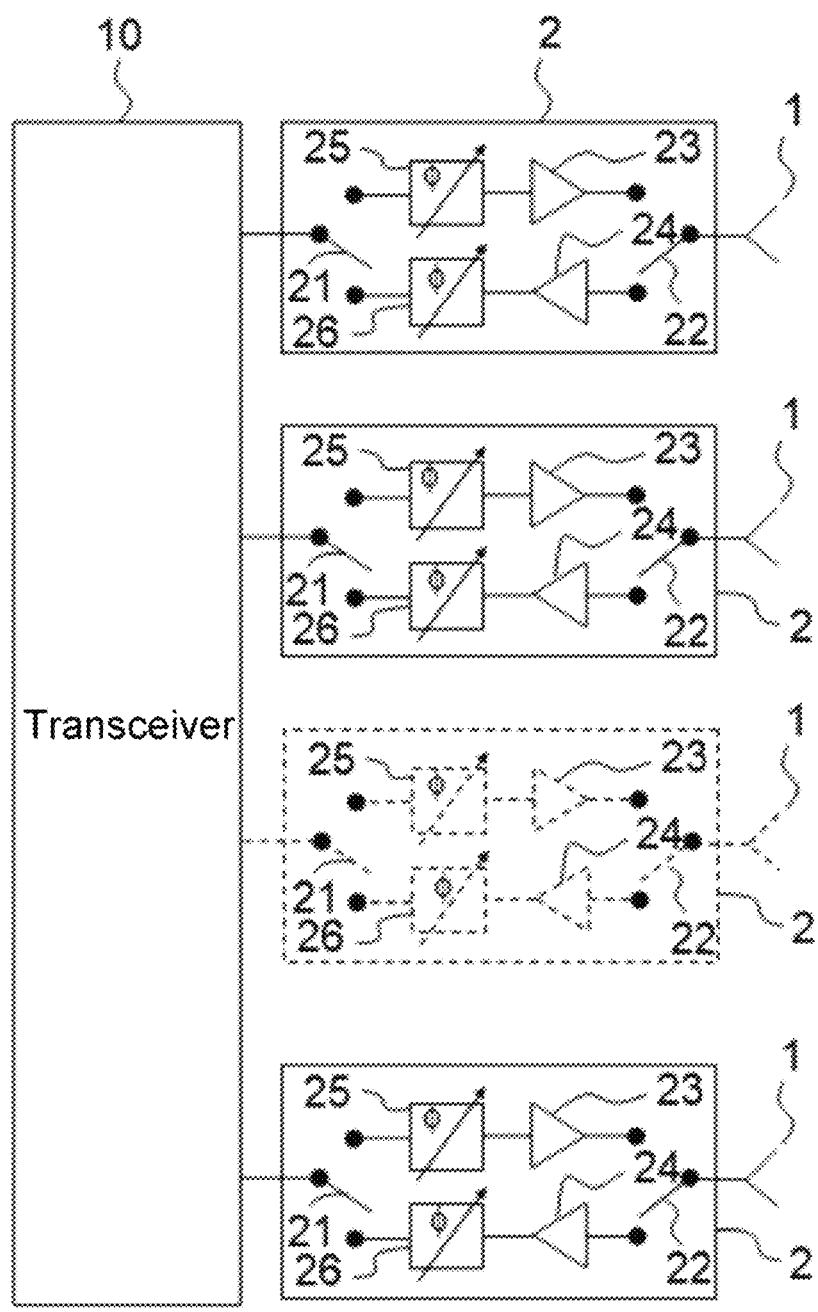
FIG. 1 is an illustration of the operating principle of an array antenna of AESA type.
Figure 2:
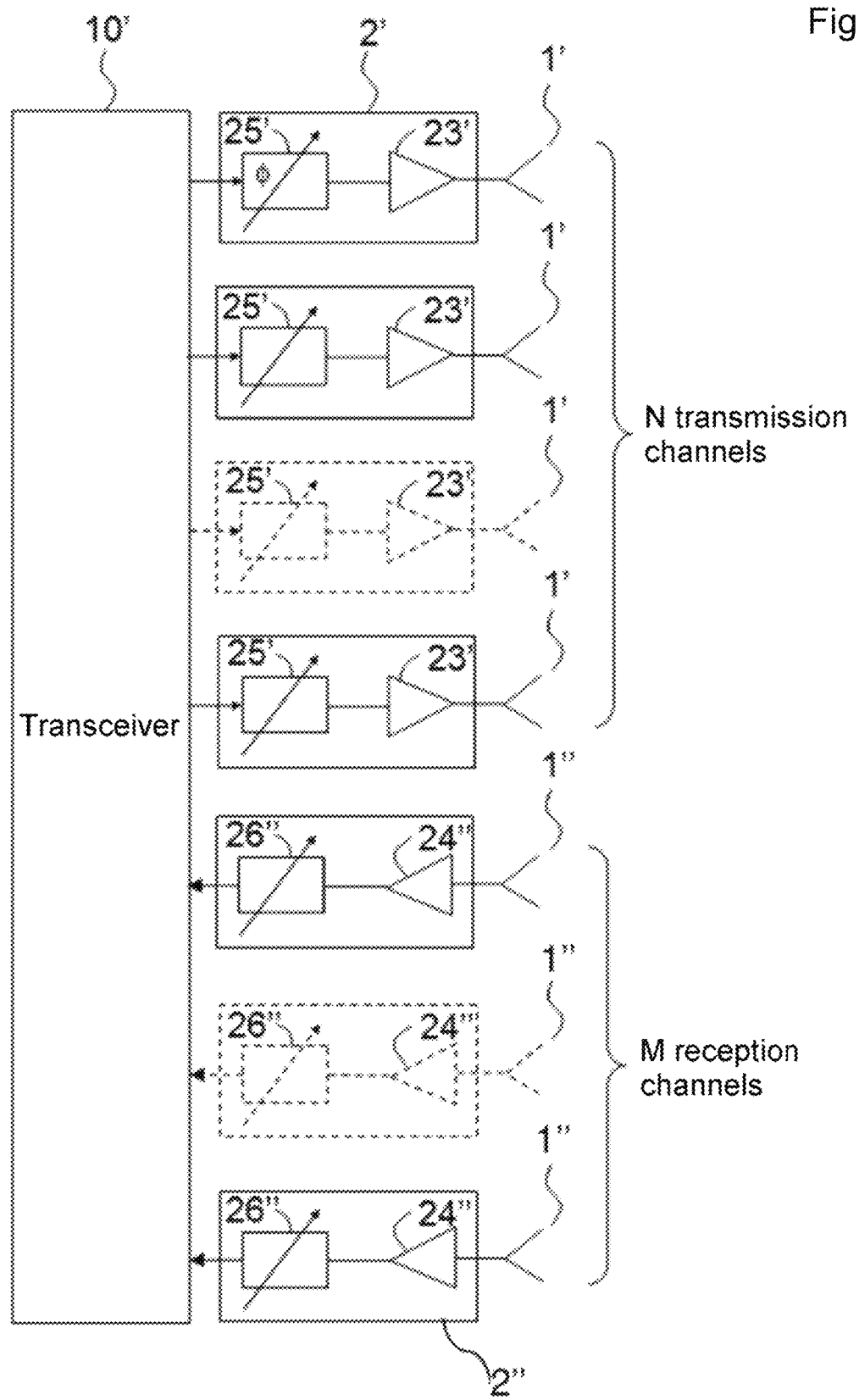
FIG. 2 is an illustration of the operating principle of an array antenna of MIMO type.

A radar according to the invention is based on an active antenna architecture, which may be a conventional electronic scanning antenna of AESA (active electronically scanned array) type or an antenna of MIMO type. FIGS. 1 and 2 recall, using simplified representations, the structure of an AESA antenna and of a MIMO antenna, respectively.

In the AESA structure illustrated by FIG. 1, each elementary antenna 1, which may operate for transmission and for reception, is connected to a radiofrequency module 2 which performs, by switching 21, 22, both transmission 23 and reception 24. The radiofrequency modules will be called TR modules (transmission and reception modules) hereinafter. To carry out the aforementioned functions, a TR module comprises power amplification means 23 (HPA) for transmission, and low-noise amplification means 24 for reception (LNA). It also comprises phase-shifters 25, 26 for phase-shifting the transmission signal and for phase-shifting the reception signal on each elementary channel. The phase-shifters are controlled by digital control means (not shown). The TR modules 2 are connected to a transmission and reception assembly 10 notably comprising the wave generators and the analogue-to-digital conversion circuits. The digital controls for the phase-shifters may be located in this assembly 10.

In the MIMO structure illustrated by FIG. 2, the elementary antennas for transmission 1' are separated from the elementary antennas for reception 1" unlike the AESA case in which one and the same elementary antenna 1 is used for transmission and for reception. An elementary antenna for transmission 1' and an elementary antenna for reception 1" is therefore associated with a transmission module 2' and with a reception module 2", respectively. Each transmission module 2' comprises a power amplifier 23' and a phase-shifter 25'. Each reception module 2" comprises a low-noise amplifier 24" and a phase-shifter 26". The phase-shifting for reception is, preferably, performed digitally after analogue-to-digital encoding of the reception signal. The transmission and reception modules are connected to a transmission and reception module 10' analogous to that of FIG. 1. In a MIMO-type configuration as illustrated by FIG. 2, transmission and reception may be simultaneous.

Throughout the rest of the description, a preferred solution, suitable for application in particular to a millimetre-wave airborne radar, able to perform an EVS (to recall, an enhanced vision system) function, is the focus.

Figure 3:
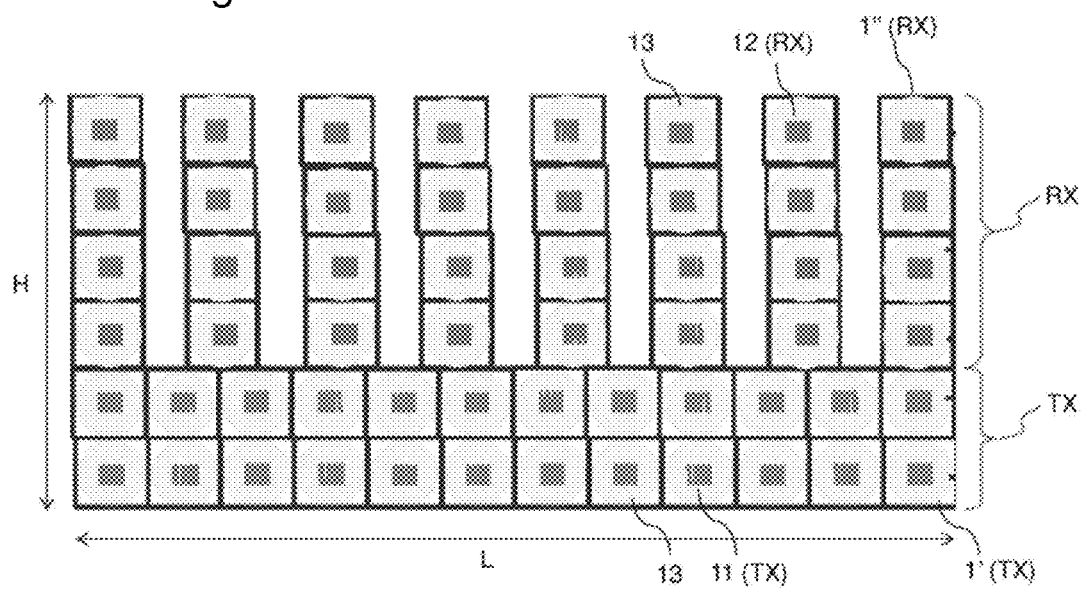
FIG. 3 is an exemplary array antenna (antenna array) of a radar according to the invention.

FIG. 3 shows an exemplary two-dimensional MIMO-type antenna array of a radar according to the invention, comprising:
two transmission lines TX each comprising 12 elementary antennas 1' (for transmission); and
four reception lines RX each comprising 8 elementary antennas 1" (for reception).

For a target circular angular resolution of the order of 0.5°, the length L of the antenna array has to be of the order of 40 cm, for a radar operating in the millimetre band at a frequency in the vicinity of 95 GHz, i.e. a wavelength λ of the order of 3 mm. Specifically, the angular resolution (in radians) is given by the quotient λ/L.

The height H of the antenna array is mainly limited by the constraints of integration on the carrier and is of the order of 20 cm, which gives a resolution substantially lower than 1° for a wavelength λ of the order of 3 mm.

All of the elementary antennas shown are identical, except in the case of a MIMO-type structure, in that the antennas 1' are configured to operate for transmission while the antennas 1" are configured to operate for reception. In an AESA-type structure, all of the elementary antennas are identical and are all configured to operate both for transmission and for reception.

Each elementary antenna typically has an angular aperture of the order of 6° in both planes (circular and elevation). An electronic scanning device, for example as described in patent application FR1910613 cited above, makes it possible to cover the range covered by each elementary antenna, for example 6°×6°, using thin beams, typically of the order of 0.5° circularly and of the order of 1.5° in elevation, near-instantaneously.

According to the invention, this coverage range is extended by electronically switching a plurality of pointing directions at the level of the elementary antennas, more specifically by supplying one or a plurality of sources of an elementary antenna with power, both for transmission and for reception.

Each elementary antenna shown in FIG. 3 comprises a lens 13, notably a dielectric lens, associated with an array 11, 12 of elementary sources, said sources being configured to illuminate the lens and at least the apertures of said sources being arranged in the focal plane of said lens. What is meant by "aperture" is the output aperture of the transmission sources and the input aperture of the reception sources (according to the direction of circulation of the RF waves in the source).

Additionally:
- each transmission elementary source is able to form a beam focused in a given direction, the directions being different from one transmission source to another for one and the same elementary antenna;
- each reception elementary source is able to receive a beam focused in a given direction, the directions being different from one reception source to another for one and the same elementary antenna;
- each transmission elementary source is connected to a power amplifier and to a switching means allowing said source to be supplied or not to be supplied with power; and
- each reception elementary source is connected to a low-noise amplifier and to a switching means allowing the signals from said source to be received or not to be received.

In the context of the invention, the antenna array does not need to be full or regularly spaced but, preferably, the antenna array exhibits the feature of not being very gappy, i.e. the elementary antennas that make up the antenna panel should represent at least 50% of the area of the panel. This makes it possible to address the twofold constraint of obtaining a long-range radar for reduced bulk.

The following figures show examples of elementary antennas according to the invention.

Figure 4A:
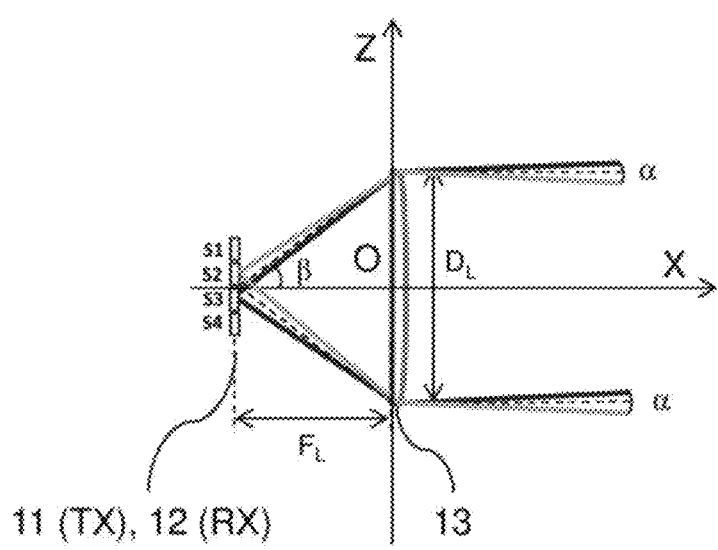
FIG. 4A and FIG. 4B are diagrams illustrating the principle of an elementary antenna having elementary sources in the focal plane of a lens.

FIG. 4A illustrates the principle, in one dimension (elevation in the direction OZ), of an elementary antenna comprising a lens 13 associated with an array of elementary sources (array denoted by 11 for transmission and 12 for reception), allowing a depointing angle in elevation for the beam formed by said antenna dependent on the position of the elementary source in the focal plane of the lens. A source whose centre is positioned in the intersection between the focal plane and the axis OX of the focal point of the lens would produce a radiation along this axis. The sources S1 and S2 arranged above the axis OX produce a beam that is depointed downwards while the sources S3 and S4 arranged below the axis OX produce a beam that is depointed upwards. The depointing angle (in radians) is given by the relationship: distance between the axis OX and the centre of the source (for example D2 for the source S2) by the focal length $F_L$.

The maximum depointing angle β obtained by the configuration illustrated is given by the relationship:

$$\tan\beta = \frac{(D_L)/2}{F_L}$$

Where $D_L$ is the diameter of the lens and $F_L$ is the focal length.

In the antenna illustrated and according to one exemplary embodiment, the focal length $F_L$ is equal to $0.8\,D_L$. Thus, tan β is equal to 0.625, and β is substantially equal to 32°.

Additionally, the diameter $D_L$ of the lens is chosen to be of the order of 10 times the operating wavelength λ of the radar.

Furthermore, each elementary source illuminating the lens makes it possible to form a focused beam having an aperture angle α which may be of the order of 6° in elevation.

Figure 4B:
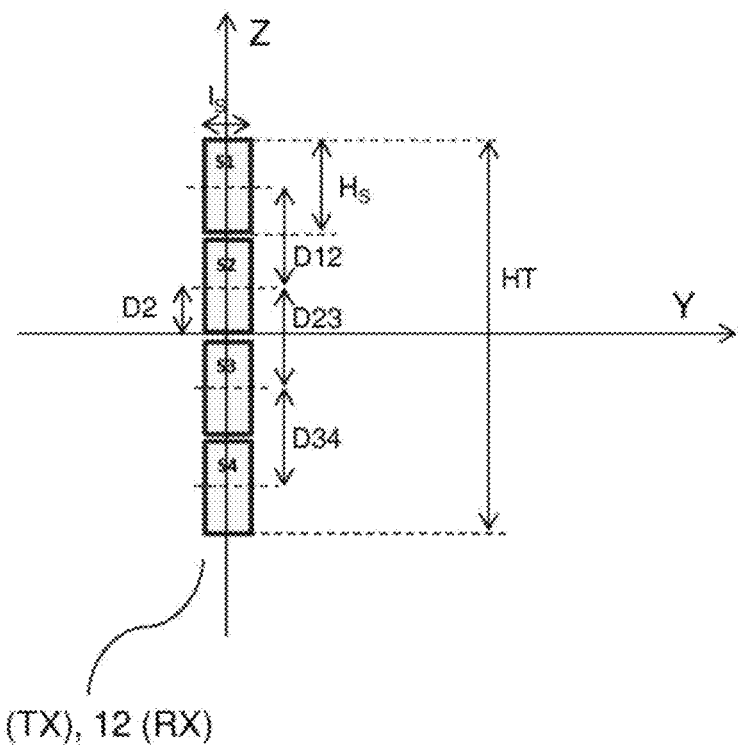

FIG. 4B illustrates, in detail, the elementary sources S1 to S4 arranged along the vertical axis OZ in the focal plane OYZ of the lens.

According to one embodiment, the sources each have, for a millimetre wave, a height Hs equal to 0.8λ and a width $I_S$ equal to 1.3 mm. The distance between the centres of two sources that are adjacent along the vertical axis OZ is equal to 0.9λ. The total height HT of the four sources is equal to 3.5λ.

Typically, the radar operates in the millimetre band at a frequency in the vicinity of 95 GHz, i.e. a wavelength λ of the order of 3 mm.

The in-phase and simultaneous supply of power to one or a plurality of sources makes it possible to form different radiation patterns according to the context.

Figure 5A:
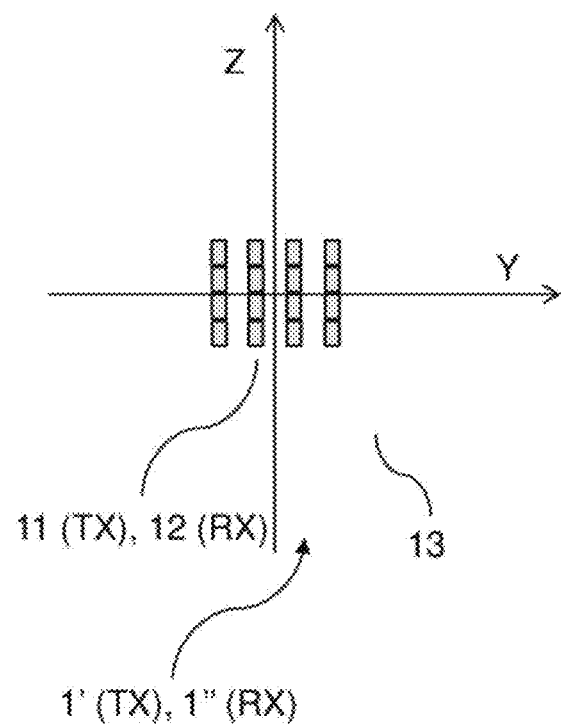
FIG. 5A shows an exemplary elementary antenna (which may be for transmission or for reception).

FIG. 5A shows an elementary antenna 1' (antenna for transmission) or 1" (antenna for reception) comprising a lens associated with an array of elementary sources, said elementary sources being in the focal plane OYZ of the lens, i.e. both along the vertical axis OZ and along the horizontal axis OY in order to act on the angular coverage in azimuth (circularly) and in elevation. FIG. 5A shows an array of 16 elementary sources Si (i varying between 1 and 16) arranged in the focal plane of the lens. This number is in no way limiting and may notably depend on the desired angular coverage and/or the target gain.

Depending on the source activated, the elementary antenna produces (for transmission) or receives (for reception) a radiation in a particular direction, these directions being different from one source to another.

It is possible to activate one or a plurality of sources simultaneously, depending on the desired pointing direction, the desired beam width, or else depending on the gain sought.

The elementary sources may be patches printed on a substrate, the plane of said substrate being arranged substantially in the focal plane of the lens.

Alternatively, the elementary sources may be waveguides and/or horns, the aperture of each waveguide and/or horn being arranged substantially in the focal plane of said lens.

Figure 5B:
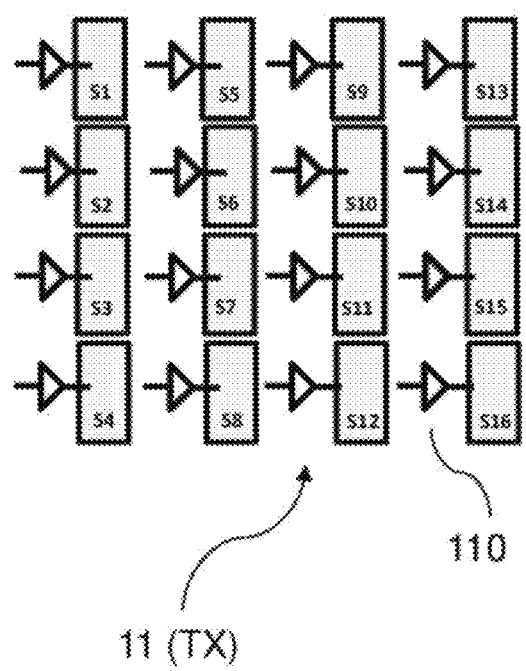
FIG. 5B details the array of elementary sources for transmission of the elementary antenna of FIG. 5A.
Figure 5C:
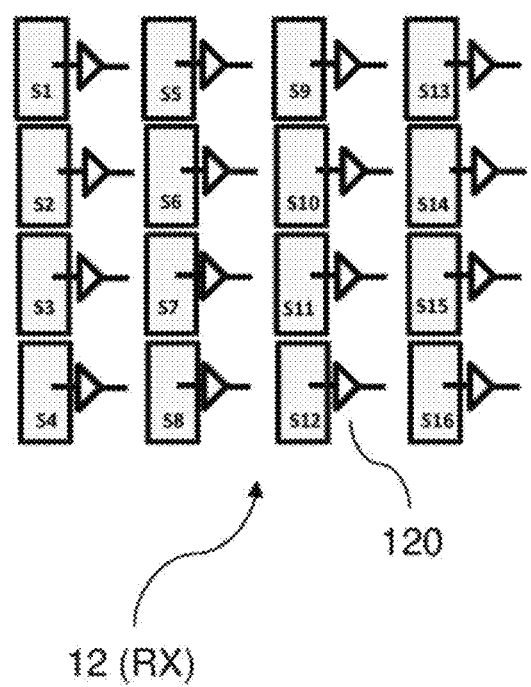
FIG. 5C details the array of elementary sources for reception of the elementary antenna of FIG. 5A.

FIGS. 5B and 5C more precisely show the array of the elementary sources for transmission (FIG. 5B) and for reception (FIG. 5C).

Each elementary source Si is connected for transmission to a power amplifier 110 and to a switching means 111 allowing one or a plurality of elementary sources to be supplied or not to be supplied with power (switching means shown in the following figures).

Symmetrically, each elementary source Si is connected for reception to a low-noise amplifier 120 and to a switching means 121 allowing the signals from one or a plurality of elementary sources to be received or not to be received (switching means shown in the following figures).

Preferably, the connection circuits for connecting the sources to the amplifiers and the switches are produced using monolithic microwave integrated circuit (MMIC) technology.

Figure 6A:
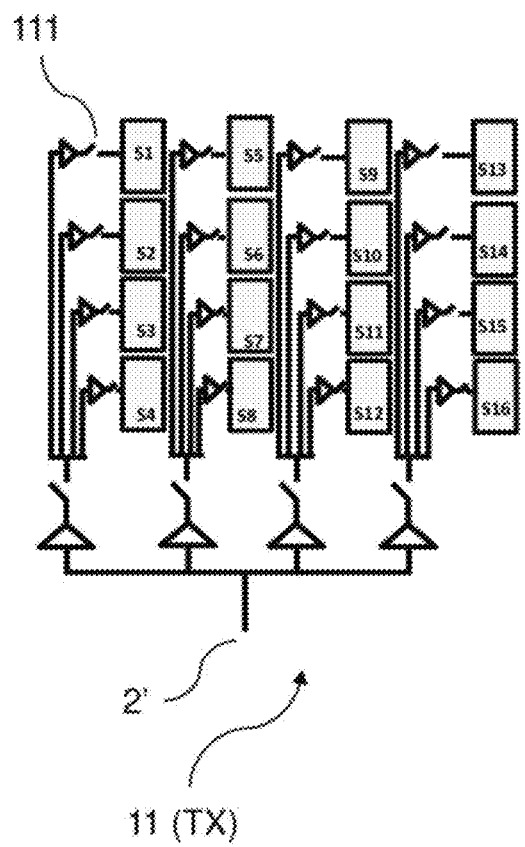
FIG. 6A shows a first connection configuration for the elementary sources for transmission of the elementary antenna of FIG. 5A.
Figure 6B:
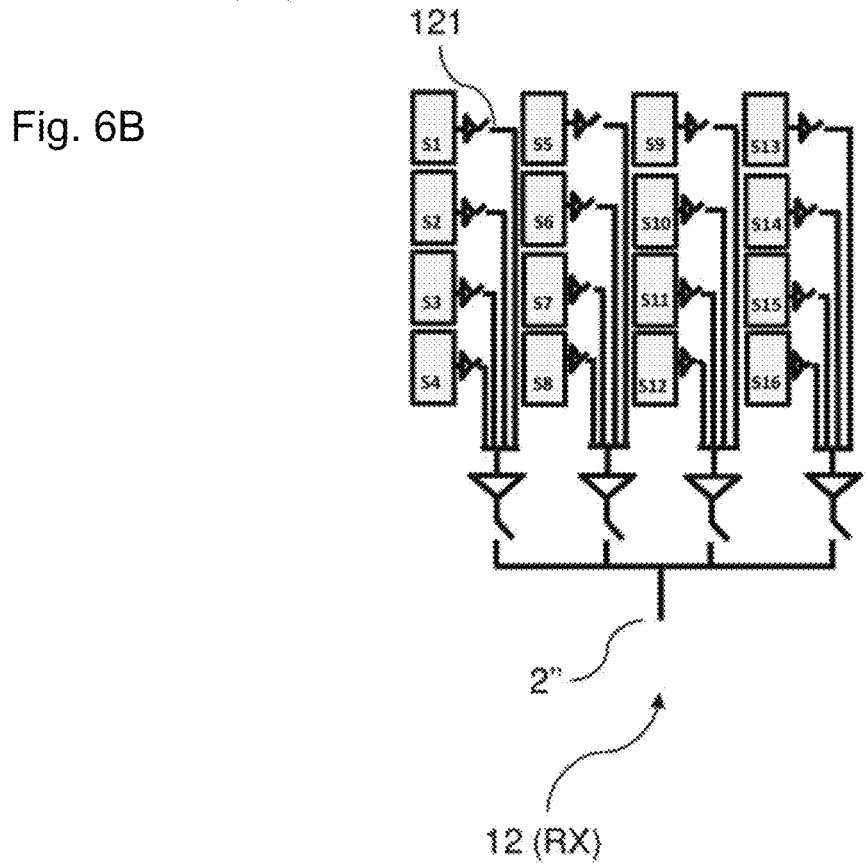
FIG. 6B shows a first connection configuration for the elementary sources for reception of the elementary antenna of FIG. 5A.

FIGS. 6A and 6B show a first connection configuration for the elementary sources for transmission and for reception, respectively, of an elementary antenna according to FIG. 5A. According to this first configuration, each elementary source Si is connected individually to an amplifier 110 (transmission), 120 (reception) and to a switching means 111 (transmission), 121 (reception). Additionally, to clearly show the link with FIG. 2 (MIMO architecture), the array 11 of sources of the elementary antenna for transmission 1' is connected to a transmission module 2' and the array 12 of sources of the elementary antenna for reception 1" is connected to a reception module 2".

This first configuration is the most flexible in that it makes it possible to supply power, on demand, to one or a plurality of sources from among all of the sources. It makes it possible, by judiciously choosing one or more simultaneously activated elementary sources, to act on the width of the resulting beam and on the overall gain for transmission and for reception. However, it requires making a substantial number of connections.

The switching may be performed upstream or downstream of the amplifiers. It may also be performed by switching these amplifiers on/off.

Additionally, as shown, switching means and amplifiers in addition may be applied at a plurality of points of one and the same transmission or reception chain (here for each column grouping together four sources).

Figure 7A:
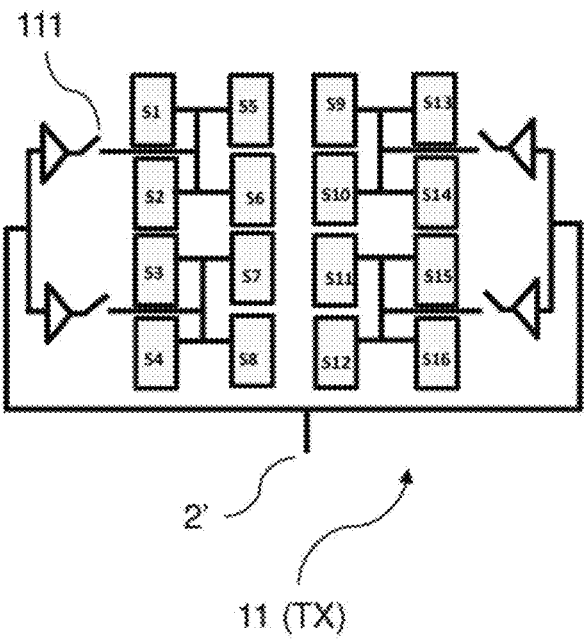
FIG. 7A shows a second connection configuration for the elementary sources for transmission of the elementary antenna of FIG. 5A.
Figure 7B:
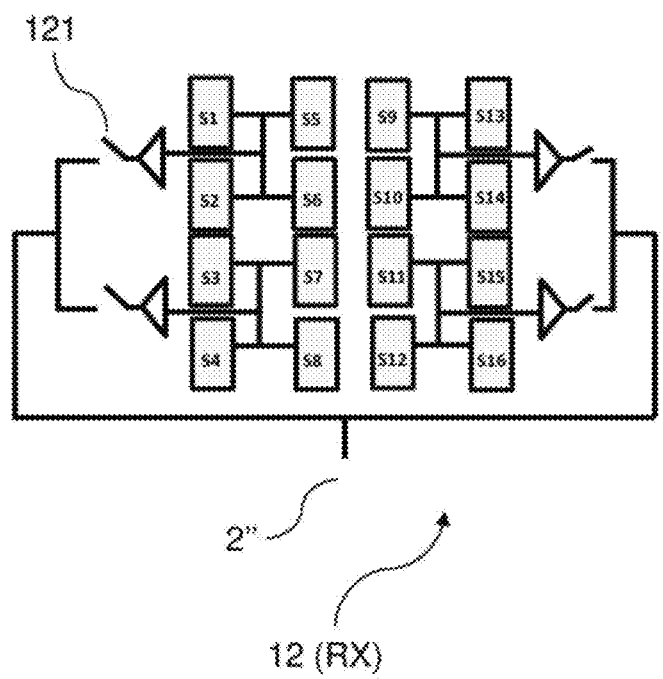
FIG. 7B shows a second connection configuration for the elementary sources for reception of the elementary antenna of FIG. 5A.

FIGS. 7A and 7B show a second connection configuration for the elementary sources for transmission and for reception, respectively, of an elementary antenna according to FIG. 5A.

According to this second configuration, a plurality of elementary sources are connected to one another, forming a grouping of sources, the switching then acting on different groupings of the array of the elementary sources. Additionally, the amplifiers are also arranged at the level of the grouping. This second configuration makes it possible to limit the number of connections.

Like for the first configuration, the switching may be performed upstream or downstream of the amplifiers. It may also be performed by switching these amplifiers on/off.

This architecture also makes it possible, by judiciously choosing the grouping of simultaneously activated elementary sources, to act on the width of the resulting beam and on the overall gain for transmission and for reception.

It will now be described how to act on the width of the resulting beam and on the overall gain for transmission and for reception, whether the array of sources is configured according to the first or second configuration.

In the case in which it is sought to obtain maximum range, and to do so in minimal processing time (the processing period T), it is possible to simultaneously activate all of the elementary sources, which produces radiation that is pre-focused by the array of sources, called "boost" mode. In this case, the lens is only partially illuminated by the array of elementary sources and there follows an illumination distribution according to an extended radiation pattern. This radiation is produced in the direction perpendicular to the array if the sources are distributed uniformly and symmetrically around the focal point of the lens. An effect of the pre-focusing is to reduce the antenna gain, but this reduction in gain is compensated for by summing the signals transmitted and received over a greater number of sources.

In the case in which maximum coverage is sought, it is possible to activate only one elementary source at a time. This configuration makes it possible, in a minimal time (16T in the case of 16 sources, T being the processing period per source, more broadly as many processing periods as there are activated sources) to cover the widest angular range. The gain of the lens is nominal since the lens is illuminated by a single source. However, the power combination is lower since just one source is activated after another, i.e. since a plurality of sources are not combined.

An intermediate solution consists in grouping together a plurality of contiguous elementary sources to form different beams. The drawback of this intermediate solution with respect to "boost" mode is the processing time which is equal to the number of beams formed multiplied by the processing period T. However, the resulting angular coverage is greater than mode boost (restricted scanning mode).

Thus, for the 16 sources shown, the scanning may, for example, be carried out in the two following modes.

Extended scanning mode (intermediate solution):

In this mode, contiguous elementary sources are grouped together in fours. In the first configuration, the groupings may be chosen. There are then nine possible groupings, which makes it possible to form nine possible beams to cover a given angular range. In the second configuration, the groupings are already preconfigured. There is therefore less choice.

The inventors determined that the width of each beam at 3 dB is then 8°, that the gain is Pe+32 dB where Pe is the transmission power of an elementary source. With all of the beams formed, in the example nine beams which overlap, it is possible to achieve an angular coverage of about 20°.

Restricted Scanning Mode (Boost Mode):

In this scanning mode, all of the sources are on simultaneously, which makes it possible to produce a central beam with a slightly extended coverage and a higher gain.

The inventors determined that the width of the beam at 3 dB is then 8°, that the gain is Pe+41 dB where Pe is the transmission power of an elementary source. In this mode, a single beam is formed, such that the angular coverage is 8° in the main pointing direction.

In the case of a landing radar, the range balance has to be optimized. The restricted scanning mode makes it possible to gain 9 dB on the balance for transmission and 6 dB on the balance for reception, which allows the range to be multiplied by 2.4 with respect to the range that can be achieved in extended scanning mode. The width of the scanned region in both modes at range limit is nearly the same, which makes it possible to view the same scene from further away by using both modes in alternation.

These two modes are given only by way of example, and other configurations are possible depending on what it is sought to obtain.

"Hybrid" modes are possible, depending on the antenna pattern and the gain resulting from the transmission/reception product that are sought.

For example, it is possible to increase the gain and the angular coverage range for transmission by activating a plurality of transmission sources or all of the transmission sources simultaneously, while retaining directivity by activating only one source or a small number of sources for reception, the reception pattern obtained coming within the range covered by the transmission pattern.

Other combinations are possible by choosing the combination of sources that are activated for reception such as, for example, the creation of ambiguous lobes for reception in the pattern formed for transmission, or vice versa, depending on what is required.

The invention, by implementing a plurality of elementary antennas (for transmission and for reception), each elementary antenna comprising an array of elementary sources that are associated with a lens (or a reflector), thus makes it possible to provide the radar with good range while allowing fine angular resolution. It further makes it possible to cover a wide angular range very quickly by virtue of a depointing of the radiation pattern of the elementary antennas which does not involve complex and expensive electronics, or lengthy and complex processing.

The invention allows the radar to dynamically optimize, according to the context, the pointing directions, the amplitude of the coverage range and the radiated power.

The invention may be used for applications other than EVS, with similar constraints. The invention may be used to form an anti-collision radar, notably for self-driving vehicles. In this application, the cone to be monitored depends on the speed of the carrier. The faster the carrier, the narrower the cone, but the greater the range has to be in order to maintain the same reaction time.

The present invention is not limited to the embodiments described above but rather extends to any embodiment that comes within the scope of the claims.

The invention claimed is:

1. An active antenna radar, comprising an array antenna comprising a first positive integer number N of transmission channels and a second positive integer number M of reception channels, each of said transmission channels and each of said reception channels comprising an antenna sub-array, called elementary antenna, wherein:
    each elementary antenna comprises a lens or a reflector associated with an array of elementary sources (Si), said elementary sources being configured to illuminate the associated lens or reflector and apertures of said elementary sources being substantially arranged in a focal plane of the associated lens or centered around a the focal point of the associated reflector;
    each elementary source associated with an elementary antenna of a transmission channel forming a beam focused in a given direction, directions being different from one elementary source to another one of the same elementary antenna;
    each elementary source associated with an elementary antenna of a reception channel being able to receive a beam focused in a given direction, directions being different from one elementary source to another one of the same elementary antenna;
    each elementary source associated with an elementary antenna of a transmission channel being connected to a power amplifier and to a switching means allowing said elementary source to be supplied or not to be supplied with power; and
    each elementary source associated with an elementary antenna of a reception channel being connected to a low-noise amplifier and to a switching means allowing the signals from said elementary source to be amplified or not amplified by said low-noise amplifier,
    the radar dynamically optimizing pointing directions, amplitude of coverage range and radiated power by providing an angular coverage of the array antenna by an electronic scan in a first angular range with unswitched elementary source or sources, and in a second angular range wider than the first angular range, by activating one given elementary source and deactivating another elementary source in an elementary antenna, allowing a depointing angle for the beam formed by said elementary antenna depending on a position of an activated elementary source in the elementary antenna with regard to the associated lens or reflector.

2. The radar according to claim 1, the elementary sources being in the form of elements printed patches on a flat substrate, the plane of said substrate being arranged substantially in the focal plane of the lens or substantially centered around the focal point of the reflector.

3. The radar according to claim 1, the elementary sources being in the form of waveguides and/or of horns, an aperture of each waveguide and/or horn being arranged substantially in the focal plane of said lens or substantially centered around the focal point of said reflector.

4. The radar according to claim 1, each elementary antenna comprising a lens, at least the apertures of the elementary sources being arranged in the focal plane of said lens.

5. The radar according to claim 4, each lens being made of a dielectric material.

6. The radar according to claim 1, the reception and transmission elementary sources of one and the same elementary antenna each being connected to a dedicated switching means and to a dedicated amplifier, respectively.

7. The radar according to claim 1, a plurality of reception and transmission elementary sources of one and the same elementary antenna being connected to one another so as to form a group of elementary sources that are connected to one and the same switching means and to one and the same amplifier, respectively.

8. The radar according to claim 1, the dimensions of the antenna array being adapted to the target angular resolution.

9. The radar according to claim 1, the switching means of an elementary antenna being adapted so as to adjust the pointing directions and/or the angular coverage of said elementary antenna, said switching means being able to activate an elementary source, a group of elementary sources or all of the elementary sources of the array of elementary sources, for transmission and for reception.

10. The radar according to claim 1, wherein said active antenna is of active electronically scanned array (AESA) type.

11. The radar according to claim 1, wherein said active antenna is of multiple-input multiple-output (MIMO) type.

12. The radar according to claim 5, wherein the dielectric material has relative permittivity lower than or equal to 4.

13. The radar according to claim 12, wherein the dielectric material has relative permittivity between 2 and 4.

14. The radar according to claim 1, wherein the radar is for viewing runways from an airliner, performing an enhanced vision system function.

15. The radar according to claim 1, wherein the radar is a motor vehicle radar for anti-collision or imaging functions for self-driving vehicles.

16. An active antenna radar, comprising an array antenna comprising a first positive integer number N of transmission channels and a second positive integer number M of reception channels, each of said transmission channels and each of said reception channels comprising an antenna sub-array, called elementary antenna, wherein:
- each elementary antenna comprises a lens or a reflector associated with an array of elementary sources (Si), said elementary sources being configured to illuminate the associated lens or reflector and apertures of said elementary sources being substantially arranged in a focal plane of the associated lens or centered around a focal point of the associated reflector;
- each elementary source associated with an elementary antenna of a transmission channel forming a beam focused in a given direction, directions being different from one elementary source to another one of the same elementary antenna;
- each elementary source associated with an elementary antenna of a reception channel being able to receive a beam focused in a given direction, directions being different from one elementary source to another one of the same elementary antenna;
- each elementary source associated with an elementary antenna of a transmission channel being connected to a power amplifier and to a switching means allowing said elementary source to be supplied or not to be supplied with power; and
- each elementary source associated with an elementary antenna of a reception channel being connected to a low-noise amplifier and to a switching means allowing the signals from said elementary source to be amplified or not amplified by said low-noise amplifier,
- by an electronic scan in a first angular range with a large group of elementary sources statically activated, and in a second angular range wider than the first angular range, by activating sequentially smaller groups of elementary sources and deactivating other elementary sources in an elementary antenna, allowing a depointing angle for the beam formed by said elementary antenna depending on a position of an activated group of elementary source in the elementary antenna with regard to the associated lens or reflector.

* * * * *